United States Patent

Douglas

[15] 3,697,178

[45] Oct. 10, 1972

[54] METHOD OF PROJECTION PRINTING PHOTORESIST MASKING LAYERS, INCLUDING ELIMINATION OF SPURIOUS DIFFRACTION-ASSOCIATED PATTERNS FROM THE PRINT

[72] Inventor: Edward Curtis Douglas, Cranbury, N.J.

[73] Assignee: RCA Corporation

[22] Filed: Nov. 1, 1971

[21] Appl. No.: 194,447

[52] U.S. Cl. ..........................355/77, 355/51, 355/66
[51] Int. Cl. ..........................................G03b 27/32
[58] Field of Search.................355/50, 51, 65, 66, 77

[56] References Cited

UNITED STATES PATENTS

| | | | |
|---|---|---|---|
| 3,469,916 | 9/1969 | Sloan | 355/66 X |
| 3,475,096 | 10/1969 | Ooue et al. | 355/66 X |
| 3,560,084 | 2/1971 | Limberger | 355/50 X |

*Primary Examiner*—Samuel S. Matthews
*Assistant Examiner*—Richard A. Wintercorn
*Attorney*—Glenn H. Bruestle

[57] ABSTRACT

A substrate covered with photoresist is positioned in a parallel, spaced, fixed relationship to a photomask to form a photomask assembly. Then, the photoresist is exposed to a diffraction image of the photomask by projecting collimated light through the photomask. The diffraction image comprises a primary image and a spurious, diffraction-associated secondary image. The light is projected with an oblique orientation to the photomask. The oblique orientation is varied during the exposing to selectively prevent the secondary image from resulting in the uncovering of corresponding areas of the substrate upon development. Then the photoresist is developed to uncover selected areas of the substrate.

15 Claims, 2 Drawing Figures

INVENTOR.
Edward C. Douglas
BY
Volker R. Ulbrich
ATTORNEY

METHOD OF PROJECTION PRINTING PHOTORESIST MASKING LAYERS, INCLUDING ELIMINATION OF SPURIOUS DIFFRACTION-ASSOCIATED PATTERNS FROM THE PRINT

BACKGROUND OF THE INVENTION

The invention relates generally to projection printing, and particularly to techniques for exposing a photoresist layer to a light pattern to form a masking layer on a substrate.

Photoprocessing generally involves the use of a light pattern to define selected areas of a surface, such as a semiconductor substrate surface, for selective processing. The selective processing may be etching, diffusion, or deposition at the selected areas of the surface. Selective processing is used for instance in making a storage tube target of the type described, for instance, in U. S. Pat. No. 3,433,996 issued Mar. 18, 1969 to P. E. Carnahan et al. comprising a photoconductor having on its surface a mosaic of insulator islands. The target may be a wafer of silicon covered on one side with a silicon dioxide layer which is etched into a high line-density array of parallel silicon dioxide bars, each extending from one edge of the wafer to the other. Such a target may be incorporated in a vidicon camera tube and the tube operated generally as described in the Carnahan et al. patent cited above. A critical aspect of making the target is the covering of the silicon dioxide layer with a masking pattern of developed photoresist which masks the areas corresponding to the bars, so that the silicon dioxide between the bars may be etched off the wafer. It is desirable because of the high line-density of the bars to generate the photoresist masking layer by diffraction image projection printing.

A photomask is spaced from the photoresist to prevent contact damage to delicate features of a high resolution photomask. Under certain conditions with the use of monochromatic collimated light, no lens is needed between the photomask and photoresist to form an exposing image on the photoresist, even where the photomask is an array of very small elements whose shadows would generally be thought to overlap even at a small distance from the photomask. Instead, the image is produced by diffraction imaging. Lensless imaging, or diffraction imaging, of the photomask pattern is desirable where high resolution is required, since every lens has inherently limited resolution because of its finite aperture, and thus excludes some available light information.

One problem with diffraction imaging, however, is the appearance in the light pattern of spurious diffraction-associated secondary patterns. These spurious secondary patterns are generally due to the interaction of dimensional irregularities of the surfaces of the photomask or photoresist with the behavior of the monochromatic, collimated light with which the photomask is illuminated. Such spurious secondary patterns result in seriously degrading faults in the developed photoresist, which generally render the printed photoresist masking layer useless.

SUMMARY OF THE INVENTION

The novel method of projection printing comprises projecting the light with an oblique orientation to the plane of the photomask and varying this orientation during the exposure.

With present methods, the spurious diffraction-associated secondary image results in the undesired appearance of secondary image patterns in the developed masking layer. With the novel method, on the other hand, the varying of the oblique orientation during exposure prevents the spurious secondary image from fully exposing the photoresist by selectively decreasing the optical density of the secondary image. The desired exposure of areas of the primary image photoresist corresponding to the primary image from the photomask remains relatively unaffected. Thus, secondary image patterns do not appear in the developed masking layer.

PREFERRED EMBODIMENTS OF THE INVENTION

EXAMPLE 1

In one embodiment, a large area high-density array of bars for defining insulating areas of a storage tube target is generated by Fresnel diffraction image projection printing with the novel method.

Figure 1:
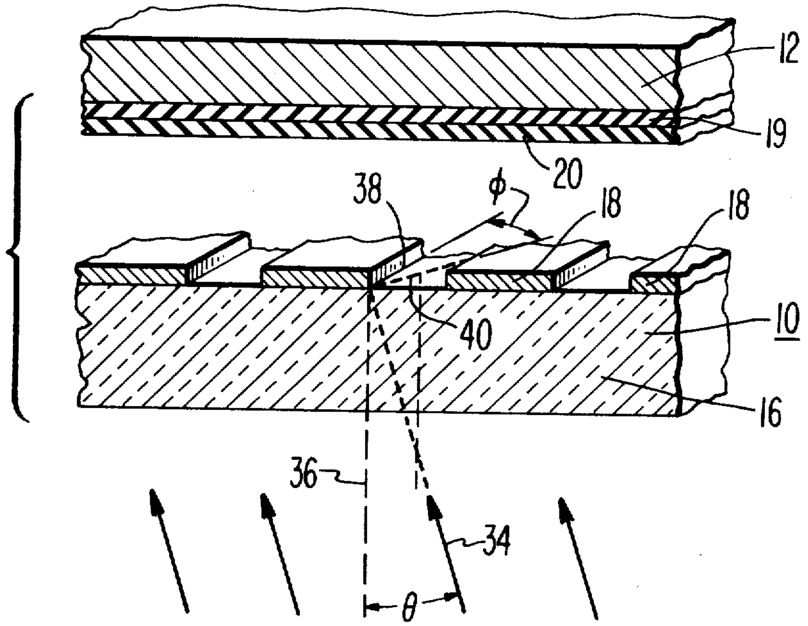
FIG. 1 is a side perspective view of a portion of an apparatus for practicing the novel method in accordance with a preferred embodiment thereof and showing the angular relationships between the photomask and light incident on it.

Referring to FIG. 1, a photomask 10 is closely spaced from, and parallel to, a silicon wafer 12. The photomask 10 is a 5 cm (centimeter) square glass plate 16 having on one side an array of opaque silver halide emulsion bars 18 which are 5.1 $\mu$m (micrometers) wide and separated by spaces of the same width, there being about 1,000 bars per centimeter. The silicon wafer 12 is about 2.0 cm in diameter and 375 $\mu$m thick. The wafer 12 is covered on one surface with a substrate layer 19 of silicon dioxide about 600 nm thick. The substrate layer 19 is covered with a layer 20 of high-resolution positive photoresist.

Figure 2:
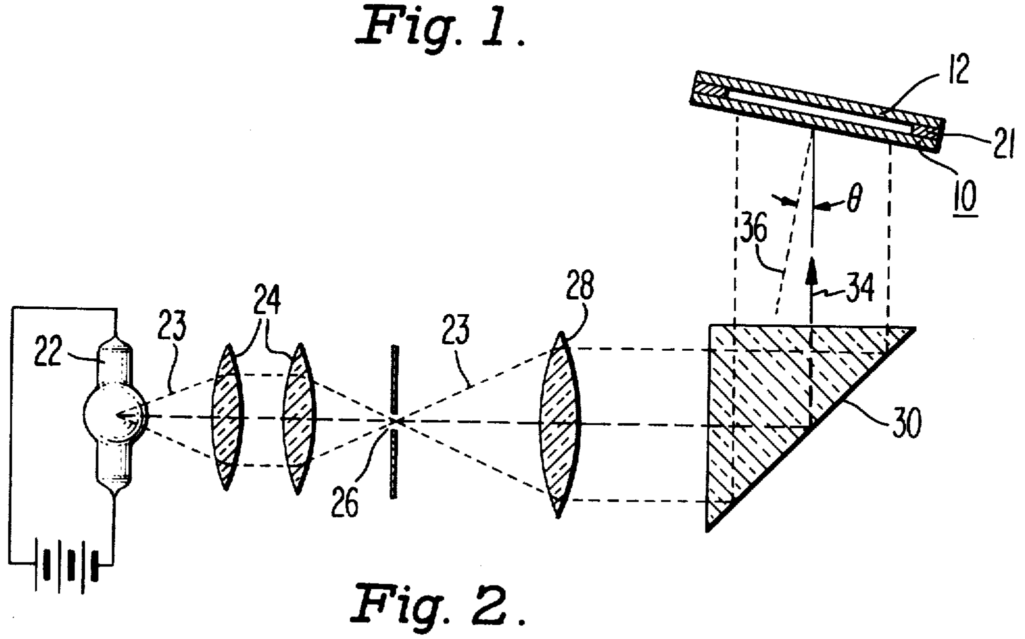
FIG. 2 is a side sectional view of an apparatus for obtaining the angular relationships of FIG. 1 between the photomask and the light.

The wafer 12 is spaced from the photomask 10 by a spacer 21 shown in FIG. 2, with the emulsion bars 18 facing the photoresist layer 20, to form a photomask assembly. The photomask assembly is rotatably mounted on a turntable (not shown), so that it can be rotated about an axis orthogonal to the plane of the photomask 10.

Exposing light for the photomask 10 is provided by apparatus shown in FIG. 2. Light from a 100-watt high pressure mercury arc lamp 22 travels, as shown by the dashed lines 23, through relay lenses 24, a limiting aperture 26, a collimating lens 28, and a prism 30 to the photomask 10. Since the lenses 24, 28 and the prism 30 absorb most of the light of wavelength shorter than about 400 nm, and since the photoresist 14 is insensitive to light of wavelength longer than about 500 nm, the active light in the illumination is that portion of the characteristic mercury arc light in the relatively narrow band of wavelengths between 400 nm—500 nm. It may thus be considered to be essentially monochromatic blue light. The coherence length of the illuminating light is about 300 $\mu$m with the direction of collimation being in the direction of the solid line 34. The exposing light is projected at an oblique angle $\theta$ of about 0.001 radians to photomask 10, this being in FIGS. 1 and 2 the angle $\theta$ between the line 34 in the direction of collimation of the light and the dashed line 36 orthogonal to the plane of the photomask 10. The oblique orientation of the light is varied during exposure by changing the direction from which the light is projected to the photomask 10, while keeping the oblique angle $\theta$ constant. This is conveniently achieved by rotating the turntable on which the photomask assembly 15 is mounted a full turn or more. The rotation changes the rotational angle $\phi$ of the light, the angle between a reference line 38 in the plane of the photomask 10 and an orthogonal projection 40 of the light direction on the plane of the photomask 10, as shown in FIG. 1.

For purposes of illustration in FIG. 1, the bottom edge of one of the bars 18 of the photomask 10 is used as the reference line 38 to form a rotational angle $\phi$ with the projection 40 of the collimated direction of the light. Both the reference line 38 and the projection 40 lie in the plane of the photomask 10.

After the exposure, the photoresist layer 20 is developed to form a pattern of bars corresponding to only the primary image of the photomask 10. The developed photoresist layer 20 is used as a masking layer for etching the silicon dioxide substrate layer 19 into bars, and then removed to result in a finished target structure.

EXAMPLE 2

In another embodiment of the novel method, the pattern of the photomask 10 of Example 1 above is printed on the photoresist-covered substrate 12 of Example 1 by diffraction self-image projection, instead of by Fresnel diffraction projection as in Example 1.

The apparatus is generally the same as that used in Example 1, except that the spacing between the photomask 10 and the photoresist layer 20 is changed to 180 $\mu$m to place the photoresist layer 20 at the first self-imaging plane of the photomask 10.

The light is projected at an oblique angle of about 0.001 radians. During exposure, the photomask assembly is rotated as in Example 1 to vary the rotational angle $\phi$.

GENERAL CONSIDERATIONS

In Fresnel diffraction projection printing, as in Example 1 above, some of the light which reaches the photoresist layer during exposure is reflected back to the photomask from the surface of the photoresist layer and interferes with the incident light. There are unavoidable variations of thickness in the photoresist layer and substrate layer, as well as variations of the wafer surface from a true plane. The surface of the photoresist layer may vary from a true plane in some areas by about 3 $\mu$m or more, resulting in high and low spots. The high and low spots result in variations in distance between the photomask and the photoresist layer which give rise to a spurious secondary image of concentric ring patterns on the photoresist. The rings are akin to the well-known Newton's rings observed with refractive lenses under certain conditions. The varying of the oblique orientation of the light with respect to the photomask during exposure in accordance with the novel method, decreases the optical density of the spurious ring patterns, so that the rings are substantially eliminated from the masking layer pattern of the developed photoresist. The desired masking layer pattern of the photomask corresponding to the primary image is substantially unaffected by the varying of the oblique orientation during exposure.

In diffraction self-image projection printing, the spurious secondary image is believed to result from imperfections in the photomask. Photomasks having a high density of elements, such as several hundred lines or more per centimeter, generally are derived from mechanically ruled masters which have some unavoidable periodic imperfections, such as periodic corrections of line spacing during the course of the ruling process. These periodic imperfections result in the generation of spurious ghost lines as a secondary image in the self-image plane at which the photoresist layer is spaced. The varying of the oblique orientation of the light during the exposure decreases the optical density of the spurious ghost lines, so that they are substantially eliminated from the masking layer pattern of the developed photoresist.

The exposure time is chosen so that the primary image, fully exposes the photoresist whereas the spurious secondary image does not fully expose the photoresist. For a given photoresist, a minimum threshold optical density of exposing light is generally required for full exposure. The optical density at an elemental area of the photoresist may be considered the product of the intensity of the exposing light and the time for which the area was exposed to the light. By the novel method, the exposing light corresponding to the spurious secondary image is moved over the photoresist during exposure so that the optical density is decreased below the threshold, while the optical density of the primary image remains relatively fixed at a value above the threshold. Thus by appropriate choice of the exposure time, the secondary image is prevented from fully exposing the photoresist. For a particular optical system and photoresist, the appropriate exposure time may be chosen by a short series of trials.

The projection of the exposing light at an oblique orientation and the varying of this oblique orientation during exposure are critical aspects of the novel method. The oblique orientation may be varied by changing either one or both of the oblique angle and the rotational angle of the light during exposure. The varying of oblique orientation has, by its very nature, a much greater effect on spurious secondary image patterns than on the primary diffraction image of the photomask pattern. The spurious secondary image patterns are a result of interactions of higher order diffractions than those of the primary diffraction image of the photomask pattern, and for that reason have a considerably greater sensitivity of the directional orientation of the light with respect to the photomask. A slight change in orientation causes the spurious secondary patterns to undergo a relatively great lateral movement over the surface of the photoresist, while the primary diffraction image of the photomask remains relatively fixed. Since a certain minimum threshold optical density, or total light flux per unit area during the entire exposure time, is needed to fully expose the photoresist, it is therefore possible to move the spurious secondary patterns over the surface of the photoresist sufficiently to decrease their optical density to below the threshold of the photoresist for a given exposure time, so that they are selectively eliminated from the pattern in the developed photoresist while the primary photomask pattern appears in the developed photoresist relatively unaffected. In some instances, the spurious secondary patterns may nevertheless have sufficient optical density to partially, but not fully, expose the photoresist. In such instance, the spurious secondary patterns will be visible as ridges in the developed photoresist but will not affect the use of the photoresist as a masking layer, since they do not result in the uncovering of substrate areas.

It is convenient for most purposes to provide the variation of the oblique orientation of exposure light by rotating the photomask assembly, as in Examples 1 and 2 above, since the only equipment needed for supplying the motion is a turntable on which the photomask assembly is mounted. The exposure light remains stationary. When the photomask assembly is rotated with the turntable, each element of the exposure light describes a cone with the apex at a fixed point of the photomask and the body extending toward the exposing light. Each cone has its apex at a fixed point on the photomask plane. Although in the Examples 1 and 2 the central axis of the cone is orthogonal to the plane of the photomask, it is in some cases desirable that the central axis of the cone be at a small angle to the plane of the photomask. Also, the cone thus described need not be circular. That is, the oblique angle may be varied as the rotational angle is varied. Either angle may be varied alone so long as the oblique angle is not zero during the entire exposure. The size of the maximum oblique angle of the light depends, among other things, upon the nature of the photomask diffraction pattern and of the spurious patterns. Useful angles are generally limited to about 0.001 radian or less, since greater angles would unduly distort the desired diffraction image pattern from the photomask. The angle should be chosen just large enough to eliminate the unwanted spurious secondary image patterns, but no larger. For high line density photomasks such as those of the preferred embodiments above, the most useful angles are in the range of from 0.005 to 0.001 radians.

The novel method applies to any projection printing wherein the primary image of the photomask to which the photoresist is exposed is an image formed by diffraction, rather than by refractive lens, and wherein spurious secondary diffraction-associated patterns appear in the image. Diffraction image projection printing is described in detail in application Ser. No. 860,865 filed Sept. 25, 1969, entitled "Method of Generating High Area-Density Periodic Arrays by Diffraction Imaging."

The photoresist-covered substrate should be substantially flat, within about 2.5 $\mu$m to 3.0 $\mu$m of a perfect plane, so that every area on it is within the depth of field of the diffraction image.

The exposing light should be monochromatic within a range of about 100 nm to provide a sharp diffraction image. Also, it should have a coherence length of about 300 $\mu$m or more. Instead of the mercury arc lamp source of Examples 1 and 2 above, a laser may be used.

In Fresnel diffraction image projection printing, as in Example 1 above, the photoresist is spaced relatively close to the photomask. The optimum spacing depends upon the wavelength of the illumination, as well as upon the line density of the elements of the photomask pattern.

In general, the spacing should be as close as possible without contact between the photomask and photoresist, but should not exceed in magnitude the smallest aperture dimension present in the photomask.

For diffraction image projection involving photomasks having a line density of about 1,000 lines per cm and illuminated with light of wavelength between 400 nm and 500 nm, the optimum spacing between the photoresist and the photomask is about 6 $\mu$m. The depth of field is about 6 $\mu$m, thus "about 6 $\mu$m" means between 3 $\mu$m and 9 $\mu$m for this application of Fresnel diffraction projection.

The photomask may have a pattern of any configuration whatever for Fresnel diffraction projection. In practice, however, Fresnel diffraction projection is used primarily for patterns having a density of detail so high as to make the use of a lens disadvantageous.

For diffraction self-image projection printing, the spacing of the photoresist from a photomask of about 1,000 lines per cm is about 180 $\mu$m. The depth of field is approximately 15 $\mu$m, thus "about 180 $\mu$m" means from 165 $\mu$m to 195 $\mu$m. The spacing varies with the wavelength of the illumination and with the distance between periodic elements of the photomask pattern. Only photomasks having a periodic pattern will form a suitable diffraction self-image. The self-image corresponds to the photomask pattern in periodicity, but may vary in element detail at spacings between image planes. Thus, primary image means the desired pattern, whether exactly that of the photomask in element detail or not. The ranges of spacings given here are ones that are found to be particularly useful for applications of diffraction image projection as in Examples 1 and 2 of the preferred embodiments. The novel method is not limited to these spacings, but rather is applicable to any diffraction image projection, whether Fresnel or self-image, wherein spurious diffraction-associated secondary patterns appear in the image.

I claim:

1. A method of projection printing, comprising:

positioning a substantially flat substrate surface covered with a layer of photoresist in a parallel, spaced, fixed relationship to a substantially flat photomask to form a photomask assembly;

exposing said photoresist layer to a diffraction image of said photomask by the projection of substantially monochromatic, collimated light through said photomask incident on said layer, said diffraction image comprising a primary image corresponding to the pattern of said photomask and a spurious diffraction-associated secondary image, and then developing said exposed photoresist layer to uncover selected areas of said substrate surface, wherein the improvement comprises:

projecting said light with an oblique orientation to the plane of said photomask during said exposing, said oblique orientation being determined by an oblique angle between the direction of collimation of said light and an orthogonal line to said photomask, and by a rotational angle between a fixed reference line in the plane of said photomask and a projection of the direction of said light intersecting said fixed line in said plane of said photomask, and then varying said orientation of said light during said exposing to selectively prevent said secondary image from resulting in the uncovering of corresponding areas of said substrate surface after said developing, said exposing being for a time period by which said primary image does result in the uncovering of corresponding areas of said substrate surface after said developing.

2. The method defined in claim 1 wherein said primary diffraction image is a Fresnel diffraction image.

3. The method defined in claim 2 wherein said varying said orientation comprises varying said oblique angle of said light.

4. The method defined in claim 2 wherein said varying said orientation comprises varying said rotational angle of said light.

5. The method defined in claim 4 wherein said rotational angle is varied by rotation of said photomask assembly about an axis orthogonal to said photomask.

6. The method defined in claim 5 wherein said photoresist covered surface is positioned with a spacing of from about 6 microns to about 180 microns from said photomask.

7. The method defined in claim 6 wherein said oblique angle is fixed at about 0.01 to about 0.001 radians during said varying of said rotational angle.

8. The method defined in claim 7 wherein said light has a coherence length of at least about 300 microns and a wavelength of about 400 nanometers to about 500 nanometers.

9. The method defined in claim 1 wherein said primary image is a diffraction self-image.

10. The method defined in claim 9 wherein said varying of said orientation comprises varying said oblique angle of said light.

11. The method defined in claim 9 wherein said varying of said orientation comprises varying said rotational angle of said light.

12. The method defined in claim 11 wherein said varying of said rotational angle is by rotation of said photomask assembly about an axis.

13. The method defined in claim 11 wherein said photoresist covered surface is positioned with a spacing of from about 6 microns to about 180 microns from said photomask.

14. The method defined in claim 13 wherein said oblique angle is fixed at about 0.01 to about 0.001 radians during said varying of said rotational angle.

15. The method defined in claim 14 wherein said light has a coherence length of at least about 300 microns and a wavelength of between about 400 nanometers to about 500 nanometers.

* * * * *